US007511310B2

(12) United States Patent
Arai et al.

(10) Patent No.: US 7,511,310 B2
(45) Date of Patent: Mar. 31, 2009

(54) LIGHT EMITTING DEVICE

(75) Inventors: Toshiaki Arai, Kanagawa (JP); Yasunobu Hiromasu, Kanagawa (JP); Motohiro Toyota, Kanagawa (JP)

(73) Assignee: Sony Corporation, Tokyo (JP)

( * ) Notice: Subject to any disclaimer, the term of this patent is extended or adjusted under 35 U.S.C. 154(b) by 118 days.

(21) Appl. No.: 11/562,179

(22) Filed: Nov. 21, 2006

(65) Prior Publication Data

US 2007/0114918 A1 May 24, 2007

(30) Foreign Application Priority Data

Nov. 22, 2005 (JP) ........................... P2005-336533

(51) Int. Cl.
*H01L 51/50* (2006.01)

(52) U.S. Cl. ............................ 257/88; 257/59; 257/72; 257/E33.001

(58) Field of Classification Search .................. 257/88, 257/59, 72

See application file for complete search history.

(56) References Cited

U.S. PATENT DOCUMENTS

2007/0057889 A1* 3/2007 Chu et al. ..................... 345/92
2007/0177090 A1* 8/2007 Shimomaki ................. 349/141

FOREIGN PATENT DOCUMENTS

JP 2004-191603 7/2004
JP 2004-347749 12/2004

* cited by examiner

*Primary Examiner*—Marcos D Pizarro
*Assistant Examiner*—Tifney L Skyles
(74) *Attorney, Agent, or Firm*—Sonnenschein Nath & Rosenthal LLP

(57) ABSTRACT

A light emitting device includes: a plurality of transistors individually corresponding to a plurality of pixels arrayed in a matrix shape, and a plurality of wiring lines connected with the transistors and disposed between the pixels. The wiring lines include signal lines connected with the transistors of the pixel columns composed of a plurality of pixels along a row direction or a column direction, and two or more common electrode lines connected with the transistors of a pixel group composed of a plurality of pixels along the row direction and the column direction. The common electrode lines are arranged on the two sides centering the signal lines.

6 Claims, 4 Drawing Sheets

LIGHT EMITTING DEVICE

CROSS REFERENCES TO RELATED APPLICATIONS

The present invention contains subject matter related to Japanese Patent Application JP 2005-336533 filed in the Japanese Patent Office on Nov. 22, 2005, the entire contents of which being incorporated herein by reference.

BACKGROUND OF THE INVENTION

1. Field of the Invention

The present invention relates to a light emitting device for emitting a light by utilizing the organic electroluminescence (as will be shortly called as the "EL") phenomenon and, more particularly, to a light emitting device capable of performing an open/short inspection reliably on a plurality of wires interposed of pixels.

2. Background Art

In recent years, the organic EL display for displaying an image by utilizing the organic EL phenomenon has been noted as one of flat panel displays. This organic EL display is utilizes the light emitting phenomenon of the organic light emitting elements themselves so that it is excellent in a wide angle of visibility and a low power consumption. Especially, the organic EL display is thought to have a sufficient responsiveness to high-speed video signals of high fineness, and its development has been progressed for practices in the image field or the like.

The organic EL display of the active matrix type is constituted such that a drive panel, which is provided with organic light emitting elements and drive elements (i.e., TFT: Thin Film Transistors) for driving the organic light emitting elements, and a sealing panel are arranged to confront each other and are adhered to clamp organic light emitting elements through adhesive layers.

As transistors to compose the organic EL display of the active matrix type, there are needed at least switching transistors for controlling the brightness of pixels and drive transistors for controlling the light emissions of organic EL elements. It is known that the threshold voltage shifts if the voltage is continuously applied to the gate electrodes of the thin film transistors. However, the drive transistors of the organic EL display have to be continuously fed with the electric current while they are causing the organic EL elements to emit lights, so that the threshold shift is easy to occur. When the threshold voltage of the transistors shifts, the current flow through the transistors fluctuates so that the light emitting elements change their brightness.

In most cases, therefore, circuits for controlling the threshold shifts of the thin film transistors have to be formed in the pixels so that the numbers of elements and wiring lines are increased to drop the production yields due to the closely arranged elements and wiring lines.

The electric method has the highest precision for detecting the positions of defects. If a method in which electric charges are once stored in individual pixels by various writing methods and the amount of the electric charges are read out through a signal line is employed, many difficulties are found for inspecting all the elements and the wiring lines of the pixels, because the elements and the wiring lines are complicated. These difficulties are encountered by the need of sufficient destaticizations before the inspection of minute charge differences or of inordinate amount of time for detecting the malfunctions of individual elements by various writing methods.

Here, the example of a long inspection time is found in a method for inspecting the open/short of switching transistors by measuring the change in a parasitic capacity (as referred to JP-A-2004-347749 (Patent Document 1)), and the example of an improvement in the detection precision is found in a method for detecting a current flow to be fed to pixel electrodes by forming switches and inspecting wiring lines at the pixel electrodes of individual pixels, that is, the pixels become denser to increase the percent defective (as referred to JP-A-2004-191603 (Patent Document 2)).

SUMMARY OF THE INVENTION

Unlike the liquid crystal display, on the other hand, the organic EL display is enabled to reduce the light emitting points merely by breaking the electrodes with a laser after completed. For inspections, therefore, it is preferred to detect continuous point defects and line defects. The continuous point defects are frequently caused by the pattern defects over a plurality of pixels, and these defects frequently induce the line defects in the design, in which wiring lines of the organic EL display are closely arranged. Therefore, the yield can be drastically improved, if only the line defect portion can be detected.

It is beneficial that methods of different kinds such as the optical inspection and the electric inspection are used together as the method for specifying the line defect portion for a short time period. If the defective line number is found by the electric method, for example, the defective point can be easily detected by searching the optical defective point existing in the optical inspection. In the electric inspection, therefore, it is necessary to detect the open/short line number exclusively for a short time by a convenient device.

For each pixel in the organic EL display, a plurality of wiring lines exist in addition to a signal line in a longitudinal direction and a scan line in a transverse direction. Those lines are frequently bundled at their terminals to form common electrodes. If, therefore, a Pad for electric inspection is formed at each of the terminals of the signal lines and the scan lines and at each of the terminals of the common electrodes so that it is constituted to perform the current detection and the voltage application, the short defect of the wiring lines for the electric inspections can be detected highly precisely for a short time period.

The open defect can be detected highly precisely for a short time period, if the Pad is disposed at the other end of the wiring line so that it can be supplied with a voltage. It is, however, necessary to prepare a system for supplying the voltage to the individual wiring lines and the area for forming the Pad.

For the liquid crystal display, there has also been invented a simple open inspecting method, as disclosed in the specification of Japanese Patent No. 2,618,042. However, this method has failed to cope with the open/short defects containing a plurality of common potential wiring lines, and is feared to become complex as an overall defect detecting method because it has to make a device for synthesizing input pulses with the inspection system.

The invention has been conceived to solve those problems. According to an embodiment of the invention, there is provided a light emitting device including a plurality of transistors individually corresponding to a plurality of pixels arrayed in a matrix shape, and a plurality of wiring lines connected with the transistors and disposed between the pixels. The wiring lines include signal lines connected with the transistors of the pixel columns composed of a plurality of pixels along (a row direction or) a column direction (although normally so, but containing a display having the signal lines arranged in the row direction), and two or more common electrode lines connected with the transistors of a pixel group composed of a plurality of pixels along the row direction and the column direction. Between the pixel columns, the common electrode lines are arranged on the two sides centering the signal lines. (For example, the common electrode lines are arranged commonly for the transistors to drive the individual pixels.)

Here, the pixel columns indicate the group of a plurality of pixels of one column along one direction without discriminating the row direction and the column direction of the pixels arrayed in the matrix shape, and the common wiring lines at this pixel column unit are called the signal lines. On the other hand, the pixel group indicates the group of pixels arrayed in the matrix shape and taken in the row direction and the column direction, and the wiring lines common in this pixel group are called the common electrode lines.

Thus, in the embodiment of the invention, the common electrode lines are arranged, on the two sides centering the signal lines, as the wiring lines arranged between the pixel columns. Therefore, the common electrode lines become hard to be shorted so that where they are opened/shorted can be detected at the column unit.

According to the embodiment of the invention, therefore, the defective line number of the open/short defects can be specified by the simple structural change and the detecting method, and the defective portion needing a repair can also be specified by using the method capable of locating the defective position for an optical inspection.

In case the open inspecting supply lines and switches disposed are left in the display panel even after the display completion, the leakage current from the switches may lower the display grade. This grade drop can be prevented by applying a potential at or lower than the threshold voltage to be employed in the switches, to the supply lines during the display, by arranging two or more transistors in series as the switches, and by cutting off the supply circuit used for the inspection, after the inspection.

In case, on the other hand, a plurality of common wiring lines are for each pixel in the longitudinal or transverse direction, the probability of specifying the line number can be improved by arranging the current detecting wiring lines at the centers of those common wiring lines, or by isolating the common wiring lines partially or wholly at the inspecting time and sharing them after the inspections with another conductors.

DESCRIPTION OF THE PREFERRED EMBODIMENTS

An embodiment of the invention is described in the following with reference to the accompanying drawings. Specifically, a light emitting device according to this embodiment relates mainly to an organic EL display, and is characterized in that the manufacture of a thin film transistor array of a high yield can be realized by efficiently detecting an open/short line defect of wires to be connected with a TFT for driving pixels and by repairing the detected defect point after the TFT is completed.

Figure 1:
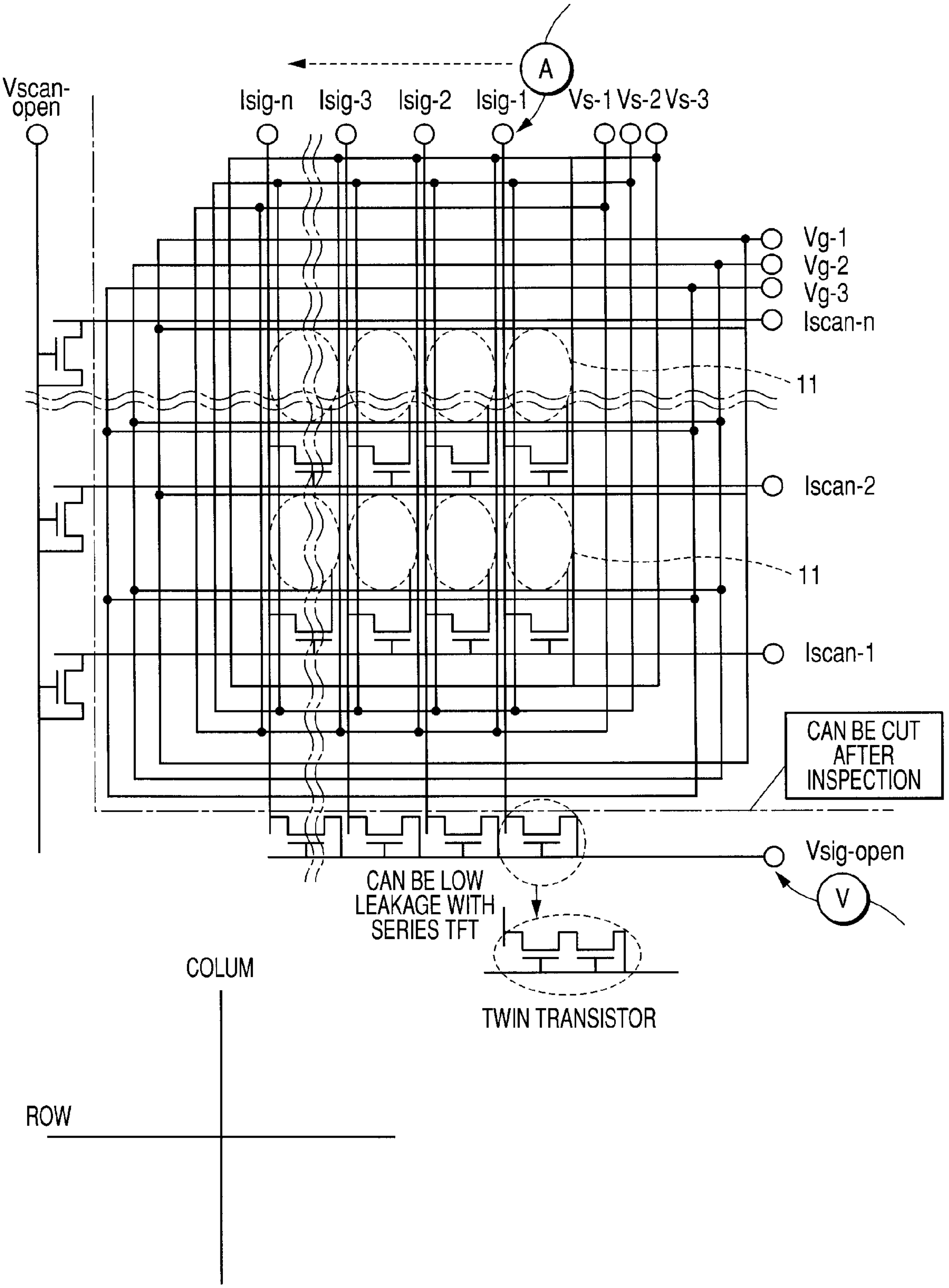
FIG. 1 is a schematic diagram (1) for explaining a light emitting device according to an embodiment of the invention.
Figure 2:
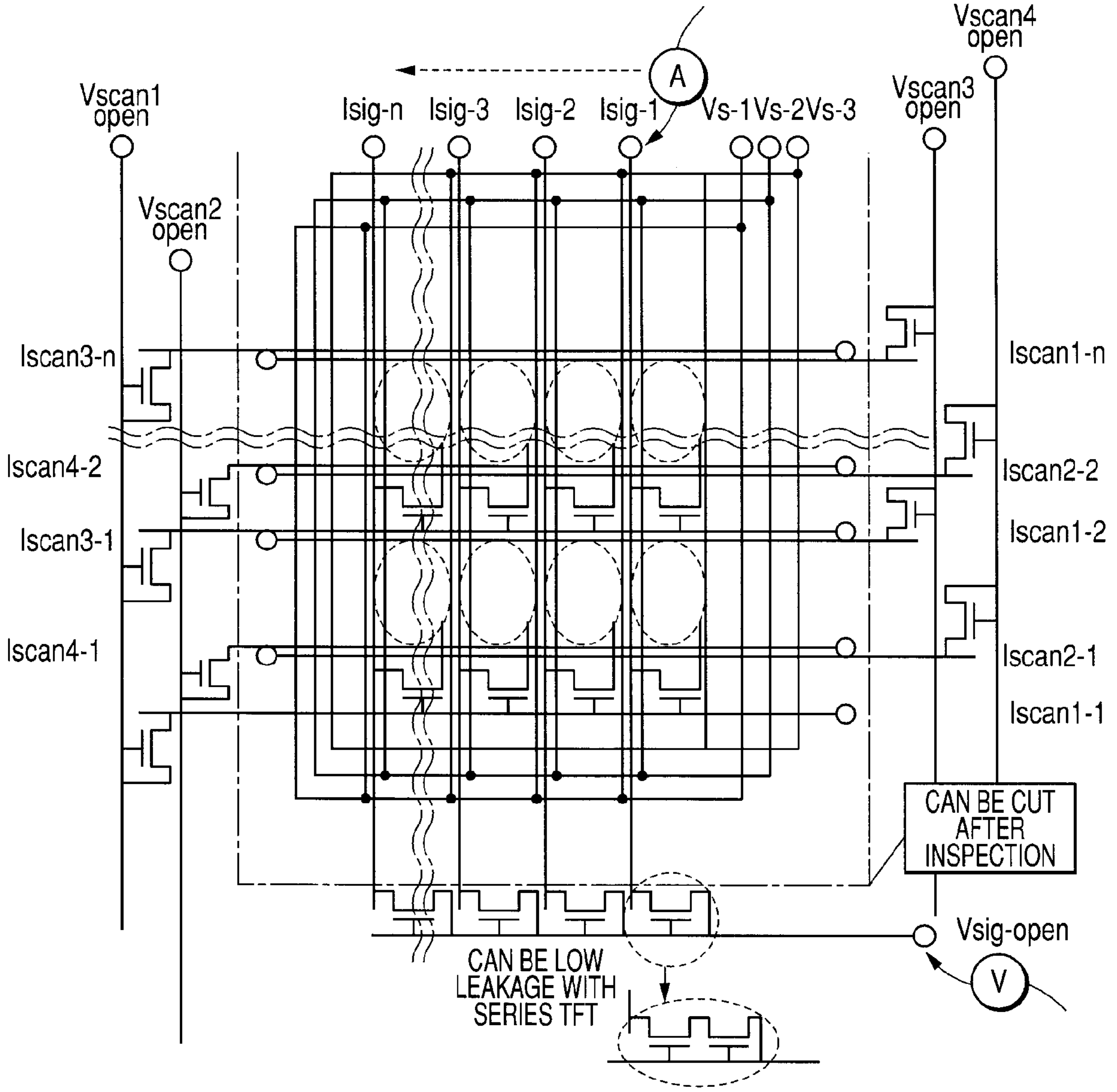
FIG. 2 is a schematic diagram (2) for explaining a light emitting device according to another embodiment of the invention.

FIG. 1 is a schematic diagram for explaining the light emitting device (1) according to an embodiment of the invention, and FIG. 2 is a schematic diagram for explaining the light emitting device (2) according to another embodiment. Here, the light emitting device (1) shown in FIG. 1 is equipped six common electrode lines Vs-1 to Vs-3 and Vg-1 to Vg-3, as will be described hereinafter, and the light emitting device (2) shown in FIG. 2 is equipped three common electrode lines Vs-1 to Vs-3, as will be described hereinafter.

These light emitting devices are so configured that a plurality of thin film transistors (as will also be merely called as "transistors") are disposed to correspond to a plurality of pixels arrayed in a matrix shape, and that the wires connected with the individual transistors are arranged between the pixels.

Figure 3:
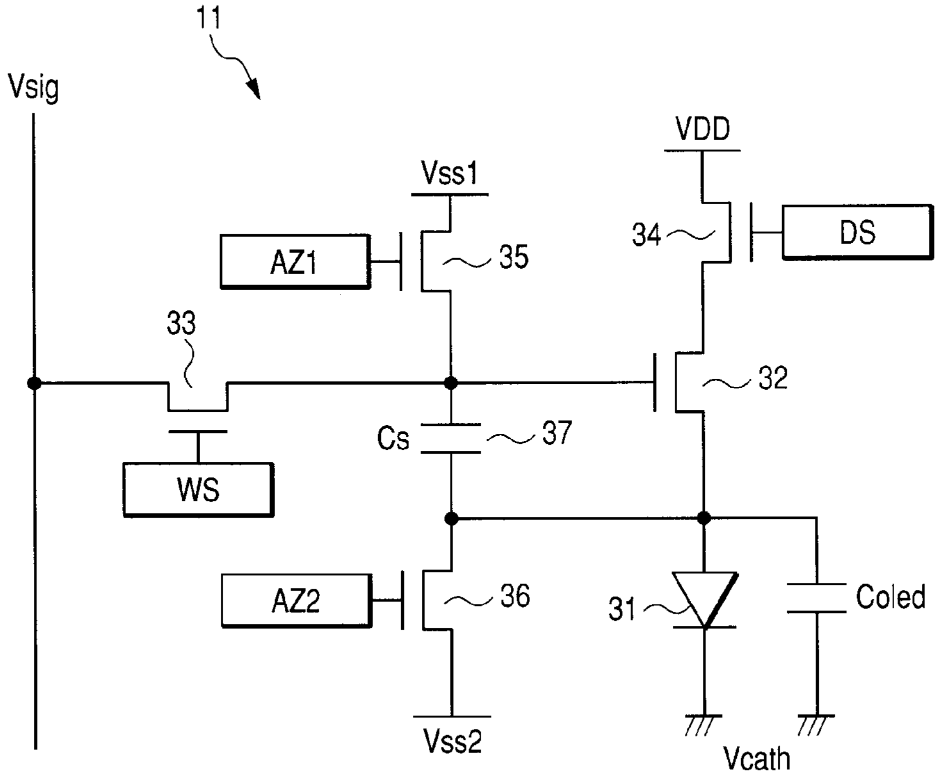
FIG. 3 is a circuit diagram for explaining a circuit configuration of a pixel circuit area.

In pixel circuits 11 (as shown in broken frames) mainly composed of the individual pixels, there are arranged a plurality thin film transistors for driving the organic light emitting elements. FIG. 3 is a circuit diagram for explaining a circuit configuration of the pixel circuit area of the display device shown in FIG. 2. This circuit configuration is equipped with five thin film transistors for the drive.

The pixel circuit 11 is configured to have circuit components of not only an organic EL element 31 but also a drive transistor 32, a sampling transistor 33, switching transistors 34 to 36, and a capacitor (or a holding capacity) 37. In short, the pixel circuit 11 of this reference example is composed of the five transistors 32 to 36 and the single capacitor 37.

In this pixel circuit 11, N-channel type TFTs (Thin Film Transistors) are used as the drive transistor 32, the sampling transistor 33 and the switching transistors 34 to 36. In the following, the drive transistor 32, the sampling transistor 33 and the switching transistors 34 to 36 will be called as the drive TFT 32, the sampling TFT 33 and the switching TFTs 34 to 36, respectively.

The organic EL element 31 is connected at its cathode electrode with a first power source potential (i.e., a ground potential GND in this embodiment). The drive TFT 32 is a drive transistor for current-driving the organic EL element 31, and at its source connected with the anode electrode of the organic EL element 31 thereby to form a source follower circuit. The sampling TFT 33 is connected at its drain with a data line Vsig, at its source with the gate of the drive TFT 32, and at its gate with a scanning line 13.

The switching TFT 34 is connected at its drain with a second supply potential VDD (or a positive supply potential in this embodiment), at its source with the drain of the drive TFT 32, and at its gate with a drive line $V_{DD}$. The switching TFT 35 is connected at its one end with a predetermined potential Vss1, at its other end with the source of the sampling TFT 33 (or the gate of the drive TFT 32), and at its gate connected with a first auto-zero line AZ1.

The switching TFT 34 is connected at its drain with a second supply potential VDD (or a positive supply potential in this embodiment), at its source with the drain of the drive TFT 32, and at its gate with a drive line $V_{DD}$. The switching TFT 35 is connected at its one end with a predetermined potential $V_{ss}$1, at its other end with the source of the sampling TFT 33 (or the gate of the drive TFT 32), and at its gate connected with a first auto-zero line AZ1.

The switching TFT 36 is connected at its source with a connection node N11 between the source of the drive TFT 32 and the anode electrode of the organic EL element 31, and at its drain with a third supply potential Vss2 (Vss2 =GND in this embodiment), ant at its gate with a second auto-zero line AZ2. Here, the third supply potential Vss2 can also be exemplified by a negative supply potential.

The capacitor 37 is connected at its one end with a connection node N12 between the gate of the drive TFT 32 and the source of the sampling TFT 33, and at its other end with the connection node N11 between the source of the drive TFT 32 and the anode electrode of the organic EL element 31.

In the pixel circuit 11 having the individual components connected in the relations thus far described, the individual components performed the following actions. Specifically, the sampling TFT 33 samples, when turned ON (conductive), the input signal voltage fed through the signal line Vsig. The signal voltage thus sampled is held in the capacitor 37. The switching TFT 34 feeds, when turned ON, the electric current from the supply voltage VDD to the drive TFT 32.

The drive TFT 32 drives the organic EL element 31 with the electric current in accordance with the signal voltage held in the capacitor 37. The switching TFTs 35 and 36 detect, when suitably turned ON, a threshold voltage Vth of the drive TFT 32 prior to the current drive of the organic EL element 31, and hold the detected threshold voltage Vth in the capacitor 37 so as to cancel the influence of threshold voltage in advance.

With the transistors of those individual pixels, there are connected various wiring lines. These wiring lines are the signal lines which are connected with transistors of pixel rows extending along the row direction or the column direction, and two or more common electrode lines which are connected with transistors of pixel groups of pixels along the row direction or the column direction.

In the embodiment shown in FIG. 1: the signal lines (lsig-1 to lsig-n) are disposed to correspond to the pixels which configure the pixel rows along the longitudinal direction of the drawing; the scan lines (lscan-1 to lscan-n) are disposed to correspond to the pixels which configure the pixel rows along the transverse direction of the drawing; and common electrode lines (Vs-1 to Vs-3 and Vg-1 to Vg-3) are disposed to correspond to the pixels (or pixel groups) along both the longitudinal and transverse directions. In other words: the signal lines (lsig-1 to lsig-n) are individually arranged between the pixel rows in the row direction; the scan lines (lscan-1 to lscan-n) are individually arranged between the pixel columns in the column direction; and the common electrode lines (Vs-1 to Vs-3, and Vg-1 to Vg-3) are individually arranged between the pixel columns in the row direction so that they may be connected to correspond to the individual pixels, and the corresponding common electrode lines are connected at the upper and lower ends, as shown.

In the common electrode line Vs-1, for example, with two transverse wires arranged transversely of the drawing at the upper and lower ends, there are connected a plurality of longitudinal wires, which are arranged between the individual pixels in the longitudinal direction of the drawing so that they are pulled from the individual longitudinal wires into the individual pixel circuit areas. Therefore, the voltage can drive, when applied to the terminals of the common electrode line Vs-1, the corresponding transistors of the individual pixels simultaneously through the transverse wires and the longitudinal wires. Here, the common electrode lines Vs-2 and Vs-3 are similar to the wires Vs-1, but the common electrode lines Vg-1 to Vg-3 are reversed in the relation between the transverse wires and the longitudinal wires from the electrode line Vs-1.

On the other hand, in the embodiment shown in FIG. 2: the signal lines (lsig-1 to lsig-n) are disposed to correspond to the pixels which configure the pixel rows along the longitudinal direction of the drawing; the scan lines (lscanl-1 to lscan1-n, lscan2-1 to lscan2-n, lscan3-1 to lscan3-n, and lscan4-1 to lscan4-n) are disposed to correspond to the pixels which configure the pixel rows along the transverse direction of the drawing; and common electrode lines (Vs-1 to Vs-3) are disposed to correspond to the pixels along both the longitudinal and transverse directions. In other words: the signal lines (lsig- 1 to lsig-n) are individually arranged between the pixel rows in the row direction; the scan lines (lscan-1 to lscan1-n, lscan2-1 to lscan2-n, lscan3-1 to lscan3-n, and lscan4-1 to lscan4-n) are individually arranged between the pixel columns in the column direction; and the common electrode lines (Vs-1 to Vs-3) are individually arranged between the pixel columns in the row direction so that they may be connected to correspond to the individual pixels, and the corresponding common electrode lines are connected at the upper and lower ends, as shown.

In the common electrode line Vs-1, for example, with two transverse wires arranged transversely of the drawing at the upper and lower ends, there are connected a plurality of longitudinal wires, which are arranged between the individual pixels in the longitudinal direction of the drawing so that they are pulled from the individual longitudinal wires into the individual pixel circuit areas. Therefore, the voltage can drive, when applied to the terminals of the common electrode line Vs-1, the corresponding transistors of the individual pixels simultaneously through the transverse wires and the longitudinal wires. Here, the common electrode lines Vs-2 and Vs-3 are similar to the wires Vs-1. Here: the common electrode line Vs-1 corresponds to VDD, as shown in FIG. 3, for example; the common electrode line Vs-2 corresponds to Vss1, as shown in FIG. 3, for example; and the common electrode line Vs-3 corresponds to Vss2, as shown in FIG. 3, for example.

In this wiring configuration, this embodiment is characterized in that two or more common electrode lines are arranged on the two sides centering the signal lines arranged between the pixel columns. As a result, the common electrode lines become hard to short-circuit, so that the open/short position can be detected on the column basis.

Next, the inspections of the open/short defects of the specific wires are described on the light emitting device having such thin film transistor array configuration. The presence/absence of the short defects and the number of the line having the short defects can be detected by applying a voltage sequentially to the common electrode lines and by detecting the electric current at the Pad (as referred to symbol circles in the drawings) at the terminals of the signal lines (lsig-1 to lsig-n) or the scan lines (lscan-1 to lscan-n).

In case the common wiring lines exist for each pixel in the longitudinal or transverse direction, the line numbers can be specified by arranging the current detecting wiring lines at the centers of common wiring lines.

Figure 4A:
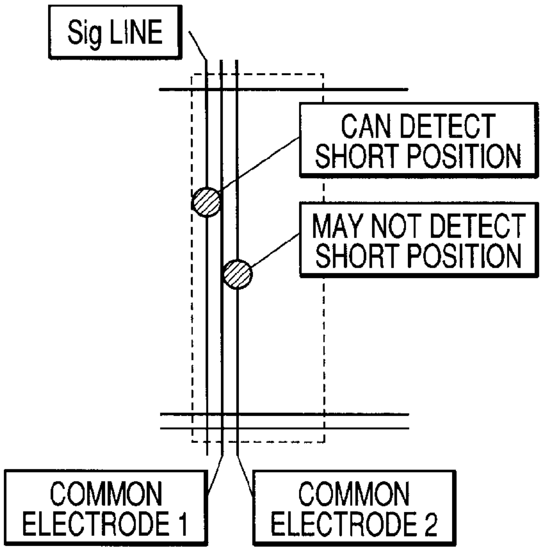
FIGS. 4A and 4B are schematic diagrams for explaining short defect inspections by wiring layouts.
Figure 4B:
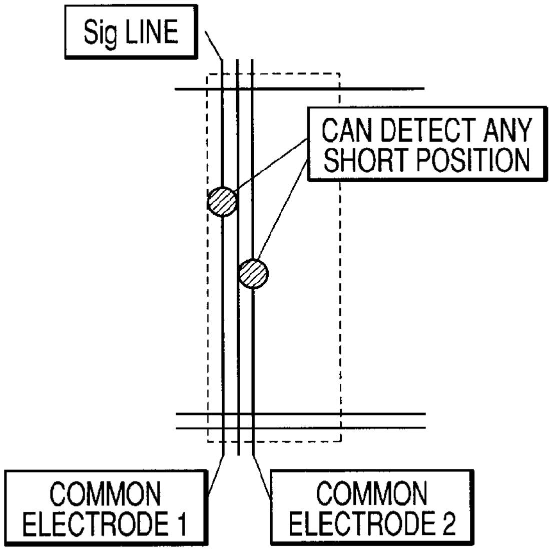

FIGS. 4A and 4B are schematic diagrams for explaining short defect inspections by the wiring layouts. FIG. 4A shows the layout of the related art, and FIG. 4B shows a layout according to this embodiment. Here is embodied the case, in which two common electrode lines 1 and 2 are laid out for one signal line Sig between the longitudinal pixel columns.

In the layout of the related art, as shown in FIG. 4A, the two common electrode lines 1 and 2 are arranged adjacent to each other with respect to one signal line Sig. The short defect easily occurs between the adjoining wiring lines. In the layout in the related art shown in FIG. 4A, therefore, the short easily occurs between the signal line Sig and the common electrode line 1 or between the common electrode line 1 and the common electrode line 2. If the short occurs in this case between the signal line Sig and the common electrode line 1, it is found that the short occurs in the pixel column having the signal line Sig, because the conduction state occurs between the signal line Sig and the common electrode line 1.

If the short occurs between the common electrode line 1 and the common electrode line 2, on the other hand, both the common electrode line 1 and the common electrode line 2 are arranged between all the pixel columns so that they are all conductive. It is, therefore, difficult to grasp what pixel columns are shorted.

In the layout of this embodiment shown in FIG. 4B, on the other hand, the single signal line Sig is arranged at the center, and the common electrode lines 1 and 2 are arranged on the two sides. The short may easily occur between the signal line Sig and the common electrode line 1 or between the signal line Sig and the common electrode line 2. In this case, any short occurs adjacent to the signal line Sig, and it is, therefore, possible to grasp that the short occurs in the pixel column having the signal line Sig.

Here is described the detection of the open defect. In order that the detection of the open defect may be performed on each wiring lines by one Pad, an open defect detecting supply line Vsig-open (as referred to FIG. 1 and FIG. 2) is formed only at the terminal end of the wiring line, on which the open defect is to be measured. There is also formed a transistor which has its gate/drain jointed to the supply line Vsig-open and its source jointed to the wiring line terminal. Here, this transistor can also be a twin transistor to lower the drain current.

The common electrode line is enabled to supply the voltage either upward and downward or rightward and leftward so that an open defect, if any, at one portion may exert no influence upon the image quality. By this wiring, it can be detected that the open defect does not exist, if a conduction is obtained between the common electrode line and either the open defect detecting supply line Vsig-open and any of the signal line lsig, and that the defect exists if the conduction is not obtained.

Here, it is desired that no electric current is fed to the image displaying time to the transistor constituting the switch to be connected with the open defect inspecting supply line Vsig-open. For this desire, the potential of the open defect inspecting supply line at the image display time is set at or lower than the threshold voltage of the transistor to be employed as the switch. Alternatively, at least one of that switch or the open defect inspecting supply line Vsig-open may be cut off after the open/short defect inspection (as referred to single-dotted lines in FIG. 1 and FIG. 2).

Figures 5A, 5B:
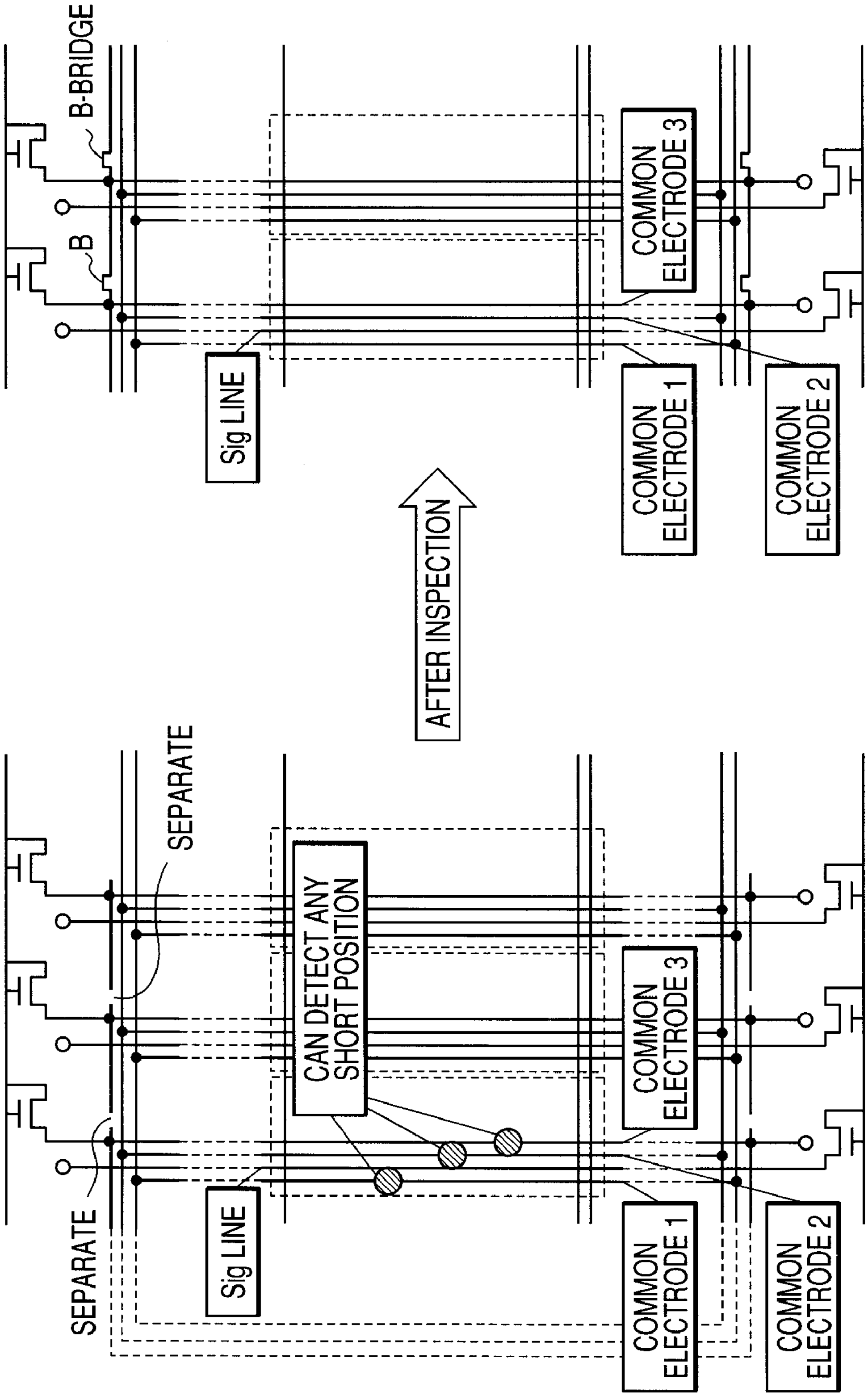
FIGS. 5A and 5B are diagrams for explaining the wirings of the cases, in which common electrode lines are three or more.

With three or more common electrode lines, the common electrode lines may be laid out in an adjacent state in the longitudinal or transverse direction. FIGS. 5A and 5B are diagrams for explaining the wirings of the cases in which the common electrode lines are three or more. In this case, with a view to enhancing the probability of specifying the defective portion, the common electrode lines are separated at the unit of the pixel column at the open/short inspecting time (as referred to FIG. 5A).

In the example shown in FIG. 5A, between the individual pixel columns, there are arranged the signal line Sig and the three common electrode lines 1 to 3, of which the lines 2 and 3 are arranged to each other. If, in this case, either the common electrode line 2 or the common electrode line 3 is separated at the pixel column unit, it is possible to grasp what pixel column the short defect between the common electrode lines 2 and 3 occurs in.

As a result, the common electrode lines can be inspected at the pixel column unit. Even if the short occurs between the common electrode line and another adjacent common electrode line, it is possible to properly grasp what pixel column the short defect occurs at.

At the step after the inspection was performed by separating the common electrode line, on the other hand, a conductor such as an anode material is used to connect a bridge B with the separated portion thereby to form a final common electrode line (as referred to FIG. 5B). As a result, the common electrode line, which has been separated at each pixel column unit, becomes conductive so that it can perform the intrinsic role as the common electrode line.

According to this embodiment, the open/short inspections of the signal lines and the common electrode lines can be reliably performed to especially improve the production yield of the organic EL display, in which one pixel circuit is equipped with many transistors thereby to increase the number of wiring lines between the pixel columns.

For the detection of the electric current, there may be adopted either the method, in which a conductive stylus is dropped in each Pad so that the quantity of the electric current detected is measured, or the method, in which the Pad is irradiated with an electron beam so that the secondary electrons emitted are detected. Moreover, this embodiment has been described on the case, in which the positional relation between the signal lines and the common electrode lines is exemplified by the column direction (or the longitudinal direction of the drawings) of the pixels. However, the invention can also be likewise applied to the relation, as taken along the row direction (or the transverse direction of the drawings) of the pixels, between the signal lines and the common electrode lines.

It should be understood by those skilled in the art that various modifications, combinations, sub-combinations and alterations may occur depending on design requirements and other factors insofar as they are within the scope of the appended claims or the equivalents thereof.

What is claimed is:

1. A light emitting device comprising:

a plurality of transistors corresponding, respectively, to a plurality of pixels arrayed in a matrix shape having rows and columns; and a plurality of wiring lines connected to the transistors and disposed between the pixels of a plurality of columns or rows, wherein the wiring lines include two or more common electrode lines, respectively connected to the transistors of the pixels of two adjacent columns or rows, a signal line positioned between two of the common electrode lines, and wherein, a short circuit condition between the wiring lines can be detected at any position along the wiring lines.

2. A light emitting device according to claim 1, wherein the pixels emit light by means of organic electroluminescence phenomena.

3. A light emitting device according to claim 1, wherein the wiring lines between any given pair of pixel columns include at least one common electrode that is not connected to any other common electrode extending between any other pair of pixel columns by means of separated portions, and wherein a bridge wiring line is disposed to connect the separated portions.

4. A light emitting device according to claim 1, wherein the signal lines include switching transistors at terminal ends thereof, so that the signals lines are connected through the individual switching transistors to a common inspection signal line.

5. A light emitting device according to claim 4, wherein the switching transistors are connected at their sources to the signal lines and at their gates and drains to the common inspection line via which an inspection signal can provided to the signal lines.

6. A light emitting device according to claim 4, wherein a voltage of the inspection signal fed to the switching transistors is equal to or lower than a threshold voltage of the transistors which drive the pixels.

* * * * *